US007274793B2

(12) United States Patent
Combest et al.

(10) Patent No.: US 7,274,793 B2
(45) Date of Patent: Sep. 25, 2007

(54) EXCURSION LIMITER

(75) Inventors: Christopher Combest, Overland Park, KS (US); John Koval, Santa Ana, CA (US)

(73) Assignee: Multi Service Corporation, Overland Park, KS (US)

( * ) Notice: Subject to any disclaimer, the term of this patent is extended or adjusted under 35 U.S.C. 154(b) by 404 days.

(21) Appl. No.: 10/213,309

(22) Filed: Aug. 5, 2002

(65) Prior Publication Data

US 2004/0022399 A1 Feb. 5, 2004

(51) Int. Cl.
*H03G 11/00* (2006.01)

(52) U.S. Cl. .......................................... 381/55; 381/98

(58) Field of Classification Search .................. 381/55, 381/56, 58, 59, 98, 102, 103, 106, 97
See application file for complete search history.

(56) References Cited

U.S. PATENT DOCUMENTS 4,122,507 A 10/1978 Queen
4,296,278 A 10/1981 Cullison et al.
4,327,250 A 4/1982 von Recklinghausen
4,583,245 A 4/1986 Gelow et al.
5,361,381 A * 11/1994 Short ......................... 381/106
5,377,274 A * 12/1994 Meyer et al. ................. 381/97
5,548,650 A 8/1996 Clark
5,815,580 A * 9/1998 Craven et al. ................ 381/59
6,385,322 B1 * 5/2002 Mietling ...................... 381/59

FOREIGN PATENT DOCUMENTS

EP 0122663 4/1984
EP 0886457 12/1998

* cited by examiner

*Primary Examiner*—Ping Lee
(74) *Attorney, Agent, or Firm*—Hovey Williams LLP

(57) ABSTRACT

An excursion limiter (10) broadly comprises a voltage controlled filter (40) to suppress an audio signal according to a selected threshold at a selected frequency using a control voltage. The voltage controlled filter (40) preferably produces an inversion signal at the frequency, amplifies the inversion signal according to the control voltage to produce a suppression signal, and combines the audio signal with the suppression signal, thus suppressing the audio signal at the frequency and creating a resultant signal. A control voltage generator (42) preferably generates the control voltage using a frequency compensation filter (58), a full-wave rectifier (60), a precision half-wave rectifier (61) and a non-linear compensator (62). The frequency compensation filter (58) isolates an initial component which is rectified by the full-wave rectifier (60), shifted, and rectified again at the precision rectifier (61) before being essentially flattened in a non-linear manner by the non-linear compensator (62).

12 Claims, 7 Drawing Sheets

EXCURSION LIMITER

BACKGROUND OF THE INVENTION

1. Field of the Invention

The present invention relates to audio equipment. More particularly, the present invention relates to a fast-acting excursion limiter for use with audio equipment and operable to limit movement of speakers to prevent damage and sound distortion.

2. Description of Prior Art

Speakers produce audible sound though physical movement of a cone. This movement is commonly referred to as excursion. Excessive excursion often causes a cone to impact other components of speakers, especially when operating at high output levels and low frequencies. This impact frequently damages speakers and causes severe distortion.

Currently, there are four methods for preventing excessive excursion. A first method is to simply avoid operation at high output levels. However, excursion can differ depending upon how many speakers are being used and how those speakers are connected. Additionally, many users simply wish to operate their audio systems at high output levels.

A second method is to broadly attenuate audio signals at low frequencies. However, many users enjoy high output levels at low frequencies. Thus, attenuating audio signals at all low frequencies prevents users from fully enjoying their audio systems.

A third method is to clip audio signals at output levels below that expected to cause excessive excursion. However, clipping audio signals produces discontinuities and severe distortion. This distortion again prevents users from fully enjoying their audio systems.

A forth method is to sense a voltage or a current supplied to speakers and, through a corrective feedback circuit, attenuate audio signals supplied to speakers. However, feedback circuits inherently have delayed reactions and cannot react quickly enough to prevent excessive excursion. Users therefore must currently choose between operating their audio systems at their optimal levels and risking the effects of excessive excursion or using one of the existing methods of limiting excursion and settling for lower performance associated therewith.

Accordingly, there is a need for an improved excursion limiter that overcomes the limitations of the prior art.

SUMMARY OF THE INVENTION

The present invention overcomes the above-identified problems and provides a distinct advance in the art of audio equipment. More particularly, the present invention provides a fast-acting excursion limiter for use with audio equipment and operable to limit movement of speakers without suffering from the limitations described above. The excursion limiter broadly comprises a fast-acting voltage controlled filter to suppress an audio signal to at or below a selected threshold at a selected frequency and a fast-acting control voltage generator to generate a control voltage used by the voltage controlled filter. The excursion limiter also preferably includes a threshold selector to select the threshold and a frequency selector to select the frequency at which maximum excursion is expected.

The voltage controlled filter preferably includes a bandpass filter that produces a bandpass inversion signal at the frequency, an analog multiplier that amplifies the inversion signal according to the control voltage to produce a suppression signal, and a summing amplifier that combines the audio signal with the suppression signal, thus suppressing or notching the audio signal at the frequency and creating a resultant signal. This combination of circuits creates a voltage controlled notch filter.

The bandpass filter preferably includes an RC network that couples with the frequency selector to filter the audio signal at the frequency. The RC network also preferably couples with an inverting operational amplifier to produce the inversion signal, which is preferably an inverted portion of the audio signal corresponding to the frequency. The analog multiplier preferably multiplies the inversion signal by the control voltage to produce the suppression signal.

The summing amplifier sums the audio signal with the suppression signal to produce the resultant signal. Summing the audio signal with the suppression signal reduces an output voltage level of the resultant signal at the selected frequency while leaving other frequencies of the audio signal substantially unchanged. It should be apparent that the excursion limiter does not clip the audio signal, but rather suppresses the audio signal according to the control voltage which will be further described below. Thus, the excursion limiter produces the resultant signal which limits the excursion of the speakers with substantially no distortion.

The control voltage generator preferably comprises a frequency compensation filter to select an initial component of the audio signal corresponding to the selected frequency, a full-wave rectifier to generate a positive direct current (DC) control signal from the initial component, a precision half-wave rectifier to generate the control voltage from the DC control signal, and a non-linear compensator to contour the control voltage. The frequency compensation filter preferably isolates the initial component of the audio signal corresponding to the frequency so that the control voltage can match the frequency. The full-wave rectifier rectifies the initial component to produce the DC control signal. The precision rectifier shifts and further refines the DC control signal into the control voltage so that the excursion limiter may react quickly with a fast-charge slow-discharge characteristic to prevent excessive excursion. The non-linear compensator contours the control voltage to achieve the desired suppression characteristics.

The threshold selector preferably comprises a switch with two sets of five positions which preferably couple with different portions of the control voltage generator in order to select the threshold. The frequency selector preferably comprises a switch with three sets of three positions. Two of the sets preferably couple with the RC network of the voltage controlled filter in order to select the frequency for the inversion signal. A third set preferably couples with the control voltage generator in order to select a proper gain for the control voltage according to the selected frequency.

As should be apparent, the amount excursion that each of the speakers experience is directly related to the output voltage level of the resultant signal each speaker receives. The higher the output voltage level, the more likely the speakers will experience excessive excursion. Therefore, a high volume signal may require more suppression at the selected frequency, in order to keep the resultant signal at or below the selected threshold, than a low volume signal. Thus, the excursion limiter preferably also includes a gain selector coupled with the control voltage generator. The gain selector preferably influences the control voltage such that the resultant signal is sufficiently suppressed at the selected frequency for any given amplifier and speaker or combinations thereof.

It can be seen that the excursion limiter of the present invention is able to react to excessive excursion before the audio signal is amplified. Additionally, it can be seen that the excursion limiter of the present invention functions in-line and does not incorporate a feedback loop. These, and other features, allow the excursion limiter to be extremely fast-acting and begin suppressing the audio signal in a first half-wave of a pulse that might otherwise result in excessive excursion. Therefore, the excursion limiter can suppress the audio signal before the speaker is able to react to the audio signal and experience any excessive excursion.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
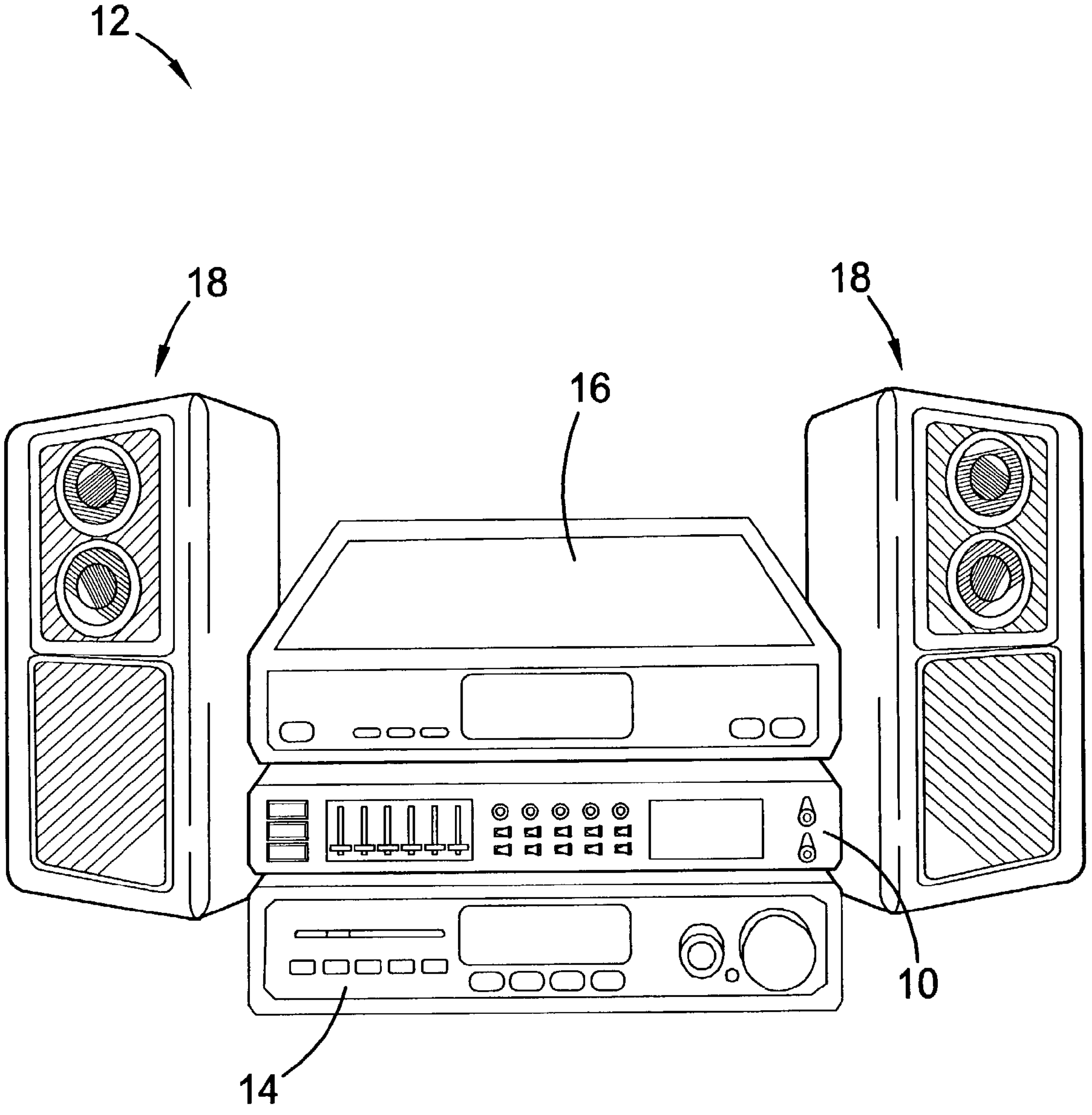
FIG. 1 is a perspective view of an excursion limiter constructed in accordance with the present invention and shown as part of a stereo system.
Figure 2:
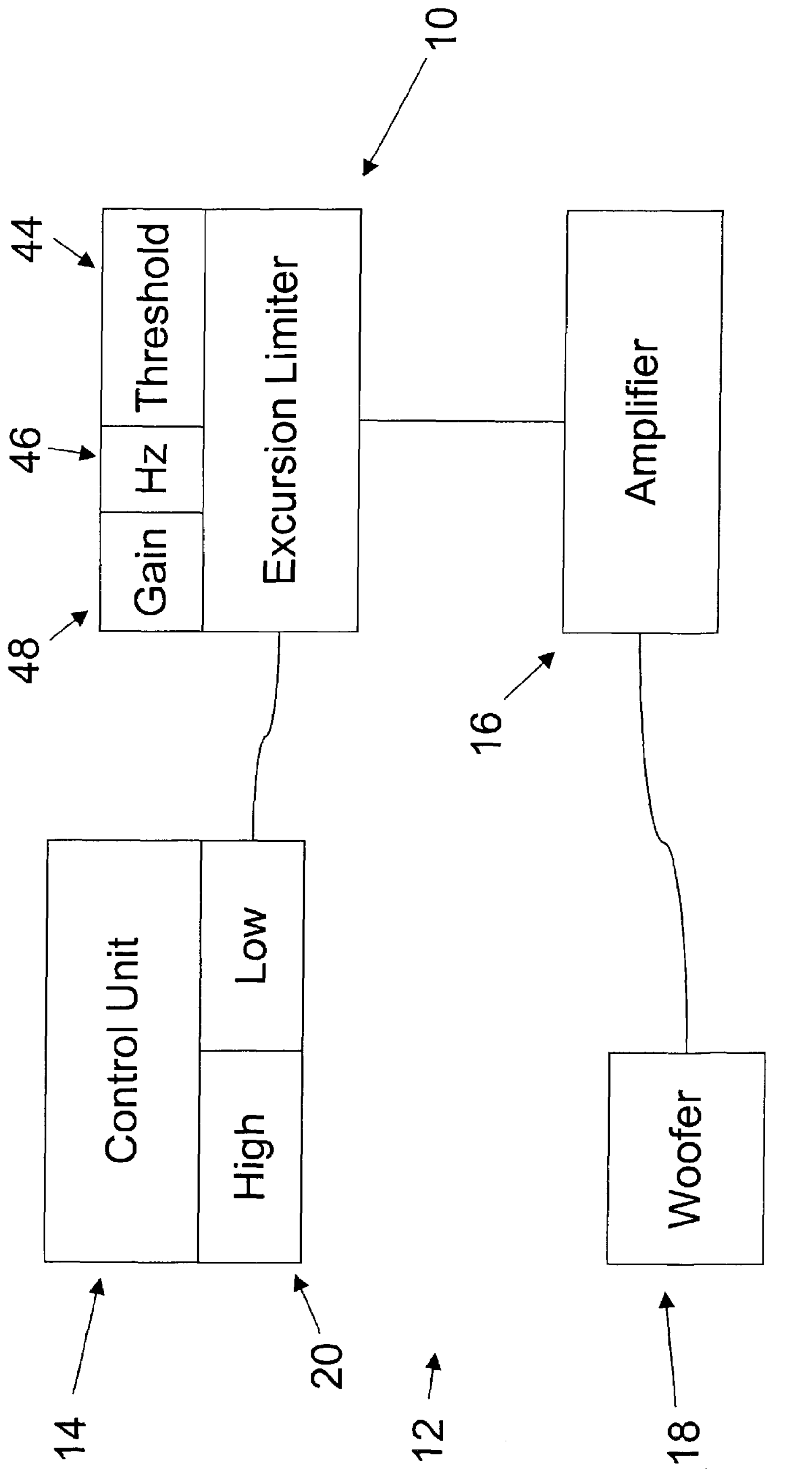
FIG. 2 is a block diagram showing a portion of one channel of the stereo system.

Referring to FIGS. 1 and 2, the preferred excursion limiter 10 in accordance with the present invention is illustrated as part of a traditional stereo system 12, or any other conventional audio system. The system 12 preferably includes a control unit 14 for providing an electrical audio signal representative of audible sound and an amplifier 16 for driving any number of speakers 18 thereby producing the audible sound. The system 12 may also include an AM/FM tuner, a cassette tape player/recorder, a compact disc player, and/or other audio equipment. The control unit 14 is preferably able to receive the audio signal from the tuner, the tape player and/or the disc player and direct the audio signal to the excursion limiter 10.

Figure 3:
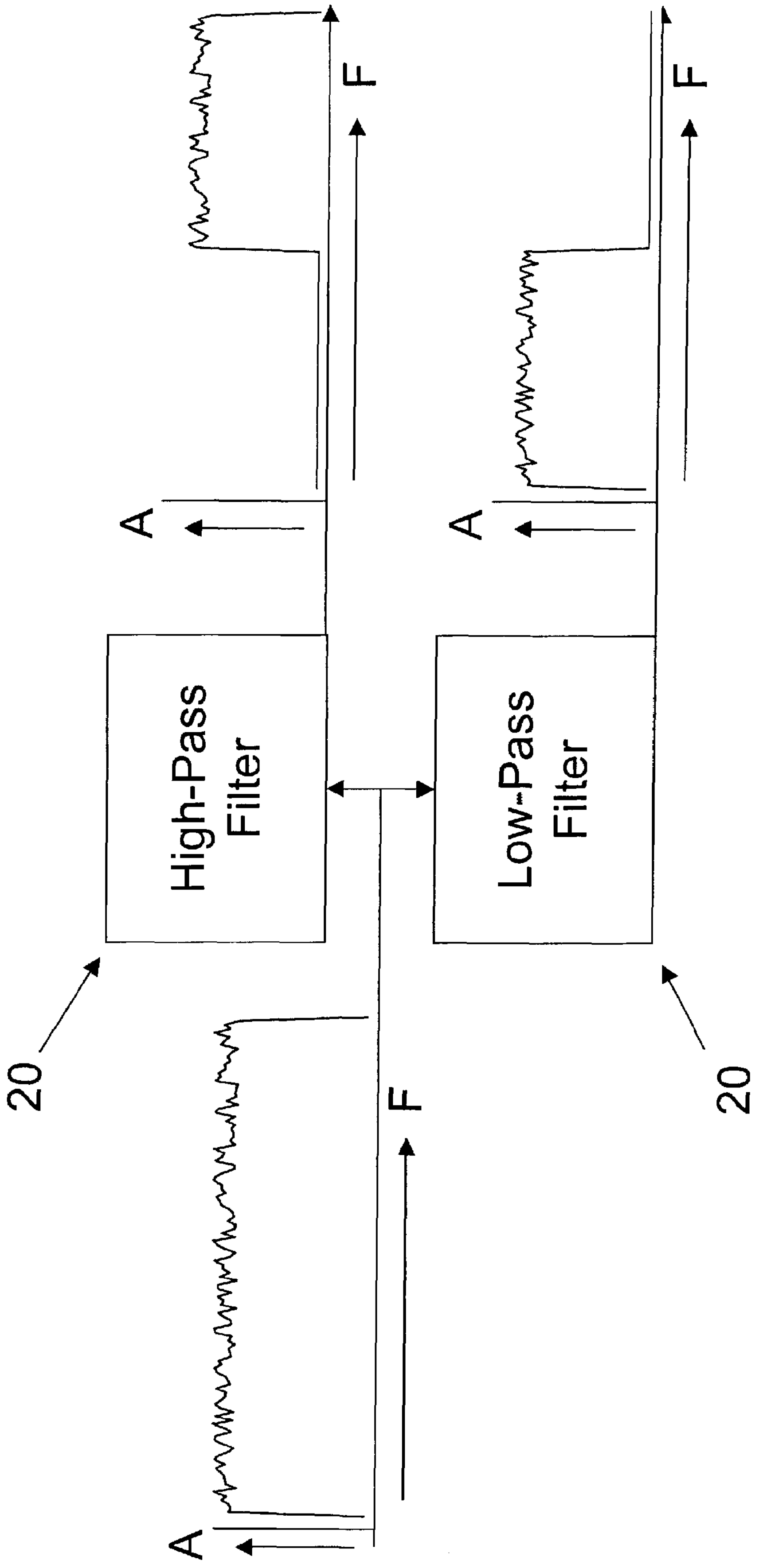
FIG. 3 is a block diagram showing frequency components of an audio signal before and after passing through two filters.

The control unit 14 preferably includes a number of filters 20 that filter the audio signal into separate frequency bands. Each frequency band can then be directed to the amplifier 16 and one or more of the speakers 18 that are better able to produce the audible sound at the frequency band. For example, as shown in FIG. 3, a low-pass filter may filter the audio signal passing only low frequencies to a sub-woofer.

It should be understood that stereo systems typically produce a left channel signal and a right channel signal, in order to produce stereo sound. Additionally, surround sound systems typically produce multiple channel signals, in order to produce surround sound. Therefore, the system 12 may utilize two or more excursion limiters 10, one for each channel signal, as well as multiple amplifier channels. Alternatively, audio systems that produce only one mono sub-woofer signal may require only one excursion limiter 10. In either case, the excursion limiter 10 of the present invention interacts with the audio signal to produce a resultant signal as will be described herein, regardless of whether the audio signal may actually be the left channel signal, the right channel signal, the mono sub-woofer signal, or any other channel signal. Thus, in the interest of simplicity, the audio signal used throughout this document will be understood to encompass either the left channel signal, the right channel signal, the mono subwoofer signal, or another signal. Additionally, while the audio signal passed thru the control unit 14 may have been amplified during production, the audio signal is preferably at a standard pre-amp level.

The amplifier 16 preferably amplifies the resultant signal received from the excursion limiter 10 so that the resultant signal is able to drive the speakers 18. The amplifier 16 preferably receives the resultant signal at or near the pre-amp level and amplifies the resultant signal many times, such as thirty, forty, fifty, or even one hundred times amplification.

The speakers 18 may comprise any combination of speaker types and/or construction, such as tweeters, mid-range, woofers, sub-woofers, and any other speaker type. Additionally, the speakers 18 may include any number of each speaker type. Furthermore, the speakers 18 may be connected in a series manner, a parallel manner, and any combination thereof. Therefore, the speakers 18 may require a different output voltage level in order to produce the audible sound at a given volume, depending upon, among other things, the number of each speaker type and the manner in which the speakers 18 are connected.

The amplifier 16 is preferably able to amplify the resultant signal to an output voltage level sufficient to drive the speakers 18. However, a cone of one or more of the speakers 18 may experience excessive movement or excursion at a high output voltage level which may be used to produce the audible sound at a high volume. Unfortunately, excessive excursion commonly causes the cone to impact other components of the speakers 18. This impact frequently damages the cone and/or the other components of the speakers 18 and causes distortion in the audible sound. Therefore, the excursion limiter 10 of the present invention limits this excursion in order to protect the speakers 18 and prevent distortion.

Relative excursion of the cone of each speaker 18 is inversely proportional to a frequency difference squared. For example, a specific sound pressure level at 30 Hertz (Hz) will require approximately four times the excursion when compared to the same specific sound pressure level at 60 Hz. Therefore, lower frequencies are more likely to cause excessive excursion. Additionally, each of the speakers 18 have a specific resonant frequency at which the excursion peaks and is most likely to cause excessive excursion for a given output voltage level. Therefore, the excursion limiter 10 of the present invention limits excursion at a specific frequency by limiting the output voltage level to at or below a specific threshold at the specific frequency.

Both the specific frequency and the specific threshold are preferably selected by a user. The specific frequency is preferably selected according to characteristics of the speakers 18, such as a resonant frequency or a frequency at which maximum excursion is expected. The specific threshold is preferably selected according to the number of each speaker type and the manner in which the speakers 18 are connected.

Figure 4:
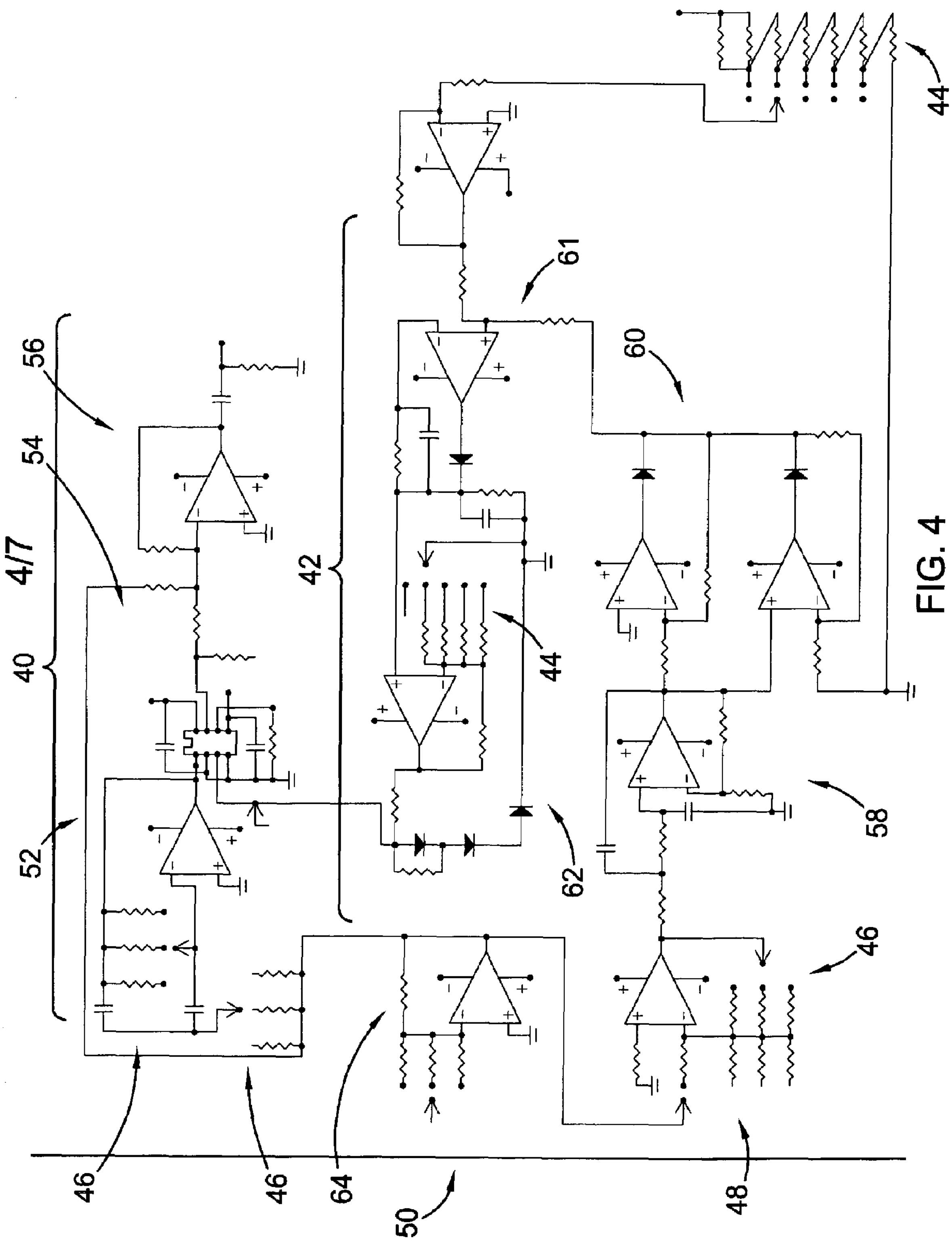
FIG. 4 is a schematic view of a preferred circuit that may be used to implement the excursion limiter of the present invention.

Referring also to FIG. 4, the excursion limiter 10 broadly comprises a voltage controlled filter 40 to suppress the audio signal at or below a selected threshold at a selected frequency and a control voltage generator 42 to generate a control voltage used by the voltage controlled filter 40. The excursion limiter 10 also preferably includes a threshold selector 44 to select the threshold, a frequency selector 46 to select the frequency, and a gain selector 48 to select an amplification level by which the amplifier 16 will amplify the resultant signal. The excursion limiter 10 may also include a signal selector 50 to select an input level at which the audio signal is received from the control unit 14.

The voltage controlled filter 40 preferably includes a bandpass filter 52 that produces an inversion signal at the selected frequency, an analog multiplier 54 that amplifies the inversion signal according to the control voltage to produce a suppression signal, and an summing amplifier 56 that combines the audio signal with the suppression signal, thus suppressing the audio signal at the selected frequency. The bandpass filter 52 preferably operates similarly to the filters 20 of the control unit 14 but passes a much narrower band of frequencies preferably centered on the selected frequency.

For example, if 34 Hz is the selected frequency, then the bandpass filter 52 may pass all frequencies between 33 Hz and 35 Hz with substantially little or no attenuation. However, the bandpass filter 52 may pass a wider or narrower band of frequencies. Therefore, in the interest of simplicity, the frequency will be used throughout this document as though the frequency represents one unique frequency. However, it is to be understood that the frequency may actually encompass a relatively narrow band of frequencies.

The band pass filter 52 preferably includes a resistor/capacitor (RC) network that couples with the frequency selector 46 to filter the audio signal at the frequency. The RC network also preferably couples with an inverting operational amplifier to produce an inverting bandpass filter and hence the inversion signal. Thus, the bandpass filter 52 produces the inversion signal, which is preferably an inverted portion of the audio signal corresponding to the frequency. The analog multiplier 54 preferably multiplies the inversion signal by the control voltage to produce the suppression signal. In this manner, the analog multiplier 54 amplifies the inversion signal according to the control voltage.

Figure 5:
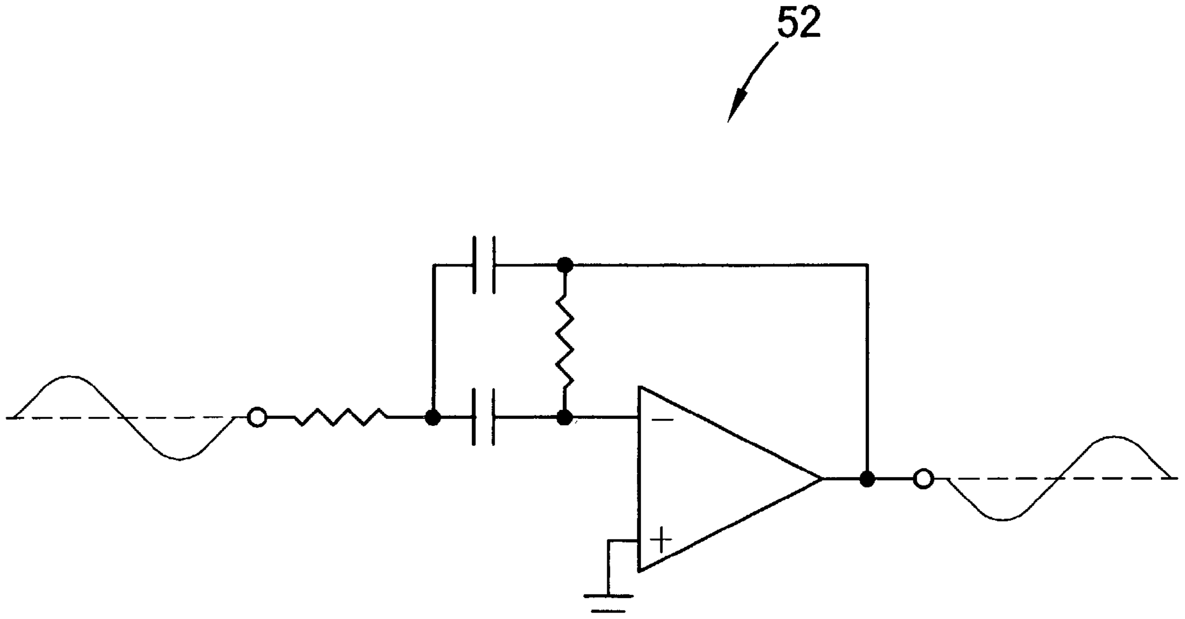
FIG. 5 is a schematic view of an inverting operation amplifier that may be used in the circuit.

For example, the RC network, in combination with the inverting operational amplifier filters the audio signal passing only the frequency, such as 34 Hz. As shown in FIG. 5, the bandpass filter 52 inverts the 34 Hz portion of the audio signal, producing the inversion signal. Therefore, the analog multiplier 54 preferably only receives the inverted 34 Hz portion of the audio signal. Then, the analog multiplier 54 amplifies the inversion signal according to the control voltage, producing the suppression signal.

The summing amplifier 56 sums the audio signal with the suppression signal to produce the resultant signal. Summing the audio signal with the suppression signal reduces the output voltage level of the resultant signal at the frequency while leaving other frequencies of the audio signal substantially unchanged in the resultant signal. It should be apparent that the excursion limiter 10 does not clip the audio signal, but rather suppresses the audio signal according to the control voltage which will be further described below. Thus, the excursion limiter 10 produces the resultant signal which limits the excursion of the speakers 18 with substantially no distortion of the audible sound.

The control voltage generator 42 preferably comprises a frequency compensation filter 58 to generate an initial component of the audio signal corresponding to the frequency, a full-wave rectifier 60 to generate a positive direct current (DC) control signal from the initial component, a precision half-wave rectifier 61 to generate the control voltage from the DC control signal, and a non-linear compensator 62 to contour the control voltage. The frequency compensation filter 58 is preferably a non-inverting low-pass filter and isolates the initial component of the audio signal corresponding to the frequency so that the control voltage can match the frequency. The initial component is then passed to the full-wave rectifier 60.

Figure 6:
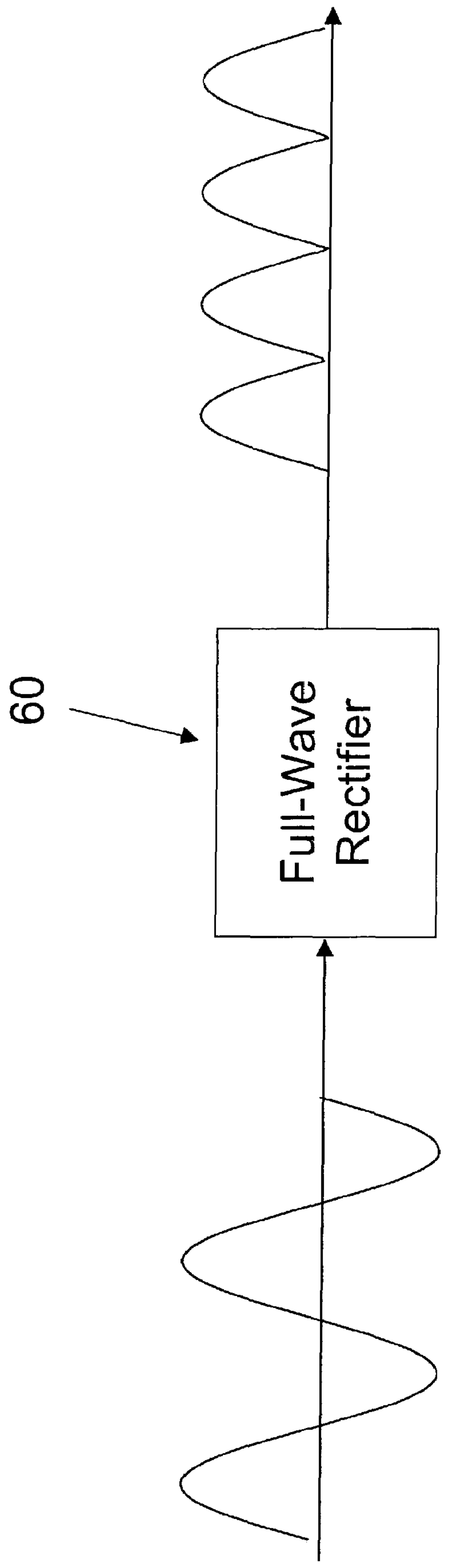
FIG. 6 is a block diagram depicting a full-wave rectifier.
Figure 7:
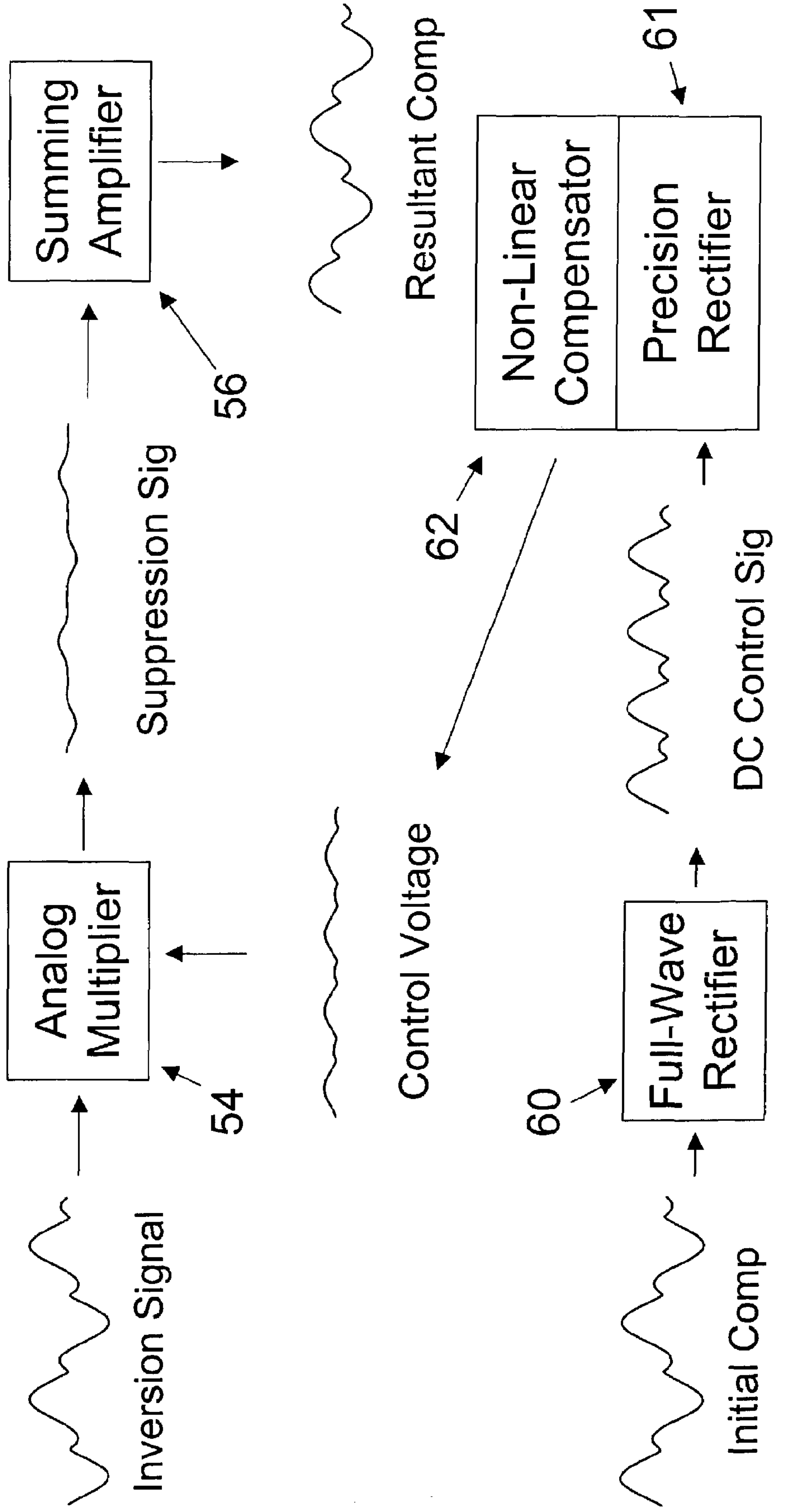
FIG. 7 is a block diagram depicting a procedure for suppressing an audio signal at a selected frequency.

The full-wave rectifier 60 creates the DC control signal from the initial component thereby allowing the excursion limiter 10 to create the control voltage in the fastest possible manner in order to prevent possible excessive excursion. As shown in FIG. 6, the full-wave rectifier 60 preferably converts negative portions of the initial component into positive equivalents. Thus, the full-wave rectifier 60 rectifies the initial component to produce the DC control signal which is essentially an absolute value of the portion of the audio signal corresponding to the frequency. The DC control signal is then passed to the precision rectifier 61.

A positive DC voltage signal is obtained from the threshold selector 44 and passed through an inverting operational amplifier producing a negative voltage signal. The DC control signal is shifted according to the negative voltage signal at the precision rectifier 61, which rectifies the negatively shifted DC control signal. Thus, only peaks of the DC control signal are passed through the precision rectifier 61.

The precision rectifier 61 preferably includes an output capacitor and a drain resistor across the capacitor. The capacitor immediately charges in response to the peaks of the DC control signal received through the precision rectifier. Since the resistor only drains a small charge from the capacitor, the capacitor is slowly discharges. Thus, the capacitor and the resistor impart a fast-charging and slow-discharging characteristic to the control voltage. The non-linear compensator 62 contours and shapes the control voltage according to a non-linear mathematical function built into the non-linear compensator 62.

As discussed above, the inversion signal is multiplied by the control voltage to produce the suppression signal. Therefore, a high positive DC voltage signal received from the threshold selector 44 will produce a low amplitude control voltage resulting in a low amplitude suppression signal so that the audio signal is minimally suppressed at the frequency. Similarly, a low positive DC voltage signal received from the threshold selector 44 will produce a high amplitude control voltage resulting in a high amplitude suppression signal so that the audio signal is more significantly suppressed at the frequency.

While it is possible to simply clip the peaks of the audio signal at the threshold, doing so would produce a distorted resultant signal with discontinuities. The distorted resultant signal would reduce the user's enjoyment of the system 12.

The threshold selector 44 preferably comprises a switch with two sets of five positions and may be a rotary-type switch or a slide-type switch. Both sets preferably couple with different portions of the control voltage generator 42. Each of the positions is preferably designed for a specific combination of speaker types and a specific manner in which the speakers 18 are connected. As discussed above, the threshold is preferably dependent upon the speakers 18. Therefore, the user is preferably able to select the threshold according to the speakers 18. For example, a first position may be designed such that one speaker 18 receives the resultant signal from the amplifier 16. A second position may be designed such that two speakers 18, connected in the series manner, receive the resultant signal from the amplifier 16. A third position may be designed such that a high-resistance speaker receives the resultant signal from the amplifier 16. However, one or more of the positions may be designed for use with more than one combination of speaker types.

The frequency selector 46 preferably comprises a switch with three sets of three positions and may be a rotary-type switch or a slide-type switch. Two of the sets preferably couple with the RC network of the bandpass filter 52 in order to select the frequency for the inversion signal. A third set preferable couples with the control voltage generator 42 in order to select a proper gain for the control voltage according to the frequency. Each of the positions preferably selects one of a plurality of possible choices for the frequency. For example, a first position may allow the user to select 26 Hz as the frequency. A second position may allow the user to select 30 Hz as the frequency. A third position may allow the user to select 34 Hz as the frequency.

As should be apparent, the excursion each of the speakers 18 experience is directly related to the output voltage level of the resultant signal each speaker 18 receives from the amplifier 16. The higher the output voltage level the amplifier 16 provides, the more likely the speakers 18 will experience excessive excursion. Therefore, the audio signal may need to be suppressed to a greater degree, in order to keep the resultant signal at or below the threshold at the frequency, depending upon the amplifier 16.

The gain selector 48 preferably comprises a switch with one set of four positions coupled with the control voltage generator 42 so that the excursion limiter 10 can sufficiently suppress the audio signal at the frequency. For example, a first position may be designed for use with amplifiers that amplify the resultant signal approximately forty times the pre-amp level. A second position may be designed for use with amplifiers that amplify the resultant signal approximately fifty times the pre-amp level. A third position may be designed for use with amplifiers that amplify the resultant signal approximately seventy times the pre-amp level. A fourth position may be designed for use with amplifiers that amplify the resultant signal approximately one hundred times the pre-amp level.

An input buffer 64 of the excursion limiter 10 ensures that the audio signal is at a nominal level as the audio signal passes through the excursion limiter 10. Since the receiver 14 may generate the audio signal above, at, or below the pre-amp level, the input portion 64 of the excursion limiter 10 is preferably able to adjust the audio signal to the nominal level. Therefore, the input portion 64 of the excursion limiter 10 preferably comprises an operational amplifier and a resistor network to ensure that the audio signal is at or near the nominal level.

The signal selector 50 preferably comprises a switch with one set of three positions coupled with the input buffer 64 in order to ensure that the audio signal is at or near the nominal level. For example, a first position may be designed to accept the audio signal at a high input power level, such as +10 decibels (dB), and slightly amplify or even attenuate the audio signal to the nominal level. A second position may be designed to accept the audio signal at a medium input power level, such as the standard pre-amp level or the nominal level. A third position may be designed to accept the audio signal at a low input power level, such as −10 dB, and amplify the audio signal sufficiently in order to raise the audio signal to the nominal level.

It should be apparent that the amplification levels of each of the operational amplifiers is not critical and is dependent upon design. For that reason, the figures do not necessarily depict these amplification levels. However, the amplification levels should be chosen such that the operational amplifiers work together to accomplish the functionality of the excursion limiter 10.

While the present invention has been described above, it is understood that other circuits and/or other frequencies can be substituted. Additionally, the excursion limiter 10 may not require the threshold selector 44, the frequency selector 46, the gain selector 48, and/or the signal selector 50, since the excursion limiter 10 may be designed to operate with a specific stereo system and not require this flexibility. Alternatively, the switches of the excursion limiter 10 may comprise any number of positions, which inherently relate to the flexibility of the excursion limiter 10. Furthermore, the system 12 may include multiple excursion limiters 10, with each excursion limiter 10 or pairs of excursion limiters 10 operating at different frequencies. These and other minor modifications are within the scope of the present invention.

Having thus described a preferred embodiment of the invention, what is claimed as new and desired to be protected by Letters Patent includes the following:

1. An excursion limiter for use with audio equipment and operable to limit movement of at least one speaker, the excursion limiter comprising:

a voltage controlled filter for suppressing a specific frequency of an audio signal according to a specific threshold, wherein the audio signal is suppressed at the specific frequency by summing the audio signal with a signal generated by an inverting bandpass filter that receives the audio signal and passes substantially only a portion of the audio signal corresponding to the specific frequency;

a frequency selector for selecting the specific frequency based upon a frequency of maximum excursion; and a threshold selector operable to select one of a plurality of predetermined thresholds based upon how many speakers are connected to the audio equipment.

2. The excursion limiter as set forth in claim 1, further including a gain selector operable to interact with the filter according to characteristics of an amplifier.

3. The excursion limiter as set forth in claim 1, further including a signal selector operable to select an input voltage level at which the audio signal is received.

4. An audio system comprising:

the excursion limiter as set forth in claim 1;

a control unit operable to provide the audio signal which is representative of audible sound;

at least one speaker operable to produce the audible sound; and an amplifier operable to drive the speaker.

5. The system as set forth in claim 4, wherein the excursion limiter is physically independent of and electrically connected between the control unit and the amplifier.

6. The system as set forth in claim 4, wherein the excursion limiter is integral to the control unit.

7. The system as set forth in claim 4, wherein the excursion limiter is integral to the amplifier.

8. An excursion limiter for use with audio equipment and operable to limit movement of at least one speaker, the excursion limiter comprising:

a voltage controlled filter for suppressing a specific frequency of an audio signal according to a specific threshold, wherein the audio signal is suppressed at the specific frequency by summing the audio signal with a signal generated by an inverting bandpass filter that receives the audio signal and passes substantially only a portion of the audio signal corresponding to the specific frequency;

a frequency selector for selecting the specific frequency based upon a frequency of maximum excursion; and a threshold selector operable to select one of a plurality of predetermined thresholds based upon the manner in which the speakers are connected.

9. An excursion limiter for use with audio equipment and operable to limit movement of at least one speaker, the excursion limiter comprising:

a voltage controlled filter for suppressing a specific frequency of an audio signal according to a specific threshold, wherein the audio signal is suppressed at the specific frequency by summing the audio signal with a signal generated by an inverting bandpass filter that receives the audio signal and passes substantially only a portion of the audio signal corresponding to the specific frequency;

a frequency selector for selecting the specific frequency based upon a frequency of maximum excursion; and a threshold selector operable to select one of a plurality of predetermined thresholds based upon power requirements of the speakers.

10. An audio system comprising:

an excursion limiter including a voltage controlled filter for suppressing a specific frequency of an audio signal according to a control voltage by summing the audio signal with a signal generated by an inverting bandpass filter that receives the audio signal and passes substantially only a portion of the audio signal corresponding to the specific frequency, thereby producing a resultant signal, a control voltage generator operable to generate the control voltage according to a specific threshold and the specific frequency, a threshold selector for selecting one of a plurality of predetermined thresholds based upon of how many speakers are connected to the audio system and the manner in which the speakers are connected, and a frequency selector operable to select the specific frequency based upon a frequency of maximum excursion;

a control unit operable to provide the audio signal which is representative of audible sound;

at least one speaker operable to produce the audible sound; and an amplifier operable to amplify the resultant signal in order to drive the speaker.

11. The system as set forth in claim 10, further including a signal selector operable select an input level at which the excursion limiter receives the audio signal from the control unit.

12. An audio system comprising:

a control unit operable to provide a signal representative of audible sound;

an amplifier operable to amplify the signal;

a number of speakers operable to produce the audible sound from the signal, after the signal has been amplified; and an excursion limiter electrically connected between the control unit and the amplifier and operable to limit movement of the speakers, the excursion limiter including a filter for suppressing the signal at a specific frequency according to a specific threshold by summing the audio signal with a signal generated by an inverting bandpass filter that receives the audio signal and passes substantially only a portion of the audio signal corresponding to the specific frequency, a threshold selector for selecting one of a plurality of predetermined thresholds based upon how many speakers are connected to the audio system and the manner in which the speakers are connected, a frequency selector operable to select the specific frequency based upon a frequency of maximum excursion, a gain selector operable to select to what degree the amplifier will amplify the signal, and a signal selector operable to select an input level at which the signal is received from the control unit.

* * * * *